United States Patent [19]
Yamazaki

[11] Patent Number: 5,494,846
[45] Date of Patent: Feb. 27, 1996

[54] METHOD OF MANUFACTURING SEMICONDUCTOR DEVICE

[75] Inventor: Toru Yamazaki, Tokyo, Japan

[73] Assignee: NEC Corporation, Japan

[21] Appl. No.: 354,557

[22] Filed: Dec. 13, 1994

[30] Foreign Application Priority Data

Dec. 17, 1993 [JP] Japan ................................ 5-317859

[51] Int. Cl.⁶ .................................................. H01L 21/76
[52] U.S. Cl. .................. 437/62; 427/24; 427/26; 427/67
[58] Field of Search ................... 437/67, 62, 24, 437/26, 20, 68; 148/DIG. 50, DIG. 85, DIG. 86, DIG. 12

[56] References Cited

U.S. PATENT DOCUMENTS

| | | | |
|---|---|---|---|
| 3,622,382 | 11/1971 | Brack et al. ................ | 437/24 |
| 4,725,561 | 2/1988 | Haond et al. ................ | 437/62 |
| 4,800,170 | 1/1989 | Jain et al. ................... | 437/24 |
| 4,810,667 | 3/1989 | Zorinsky et al. ............ | 437/62 |
| 4,959,329 | 9/1990 | Okamoto et al. ............ | 437/24 |
| 5,376,560 | 12/1994 | Aronowitz et al. .......... | 437/26 |

FOREIGN PATENT DOCUMENTS

| | | | |
|---|---|---|---|
| 4127925A1 | 2/1993 | Germany ................... | 437/26 |
| 0148394 | 12/1978 | Japan ........................ | 437/62 |
| 61-121468 | 6/1986 | Japan . | |

OTHER PUBLICATIONS

Study on Bi–CMOS ... Technology, Reprint of Electronics Letter, Jul. 1989, 2 pages, S. Matsumoto et al.

*Primary Examiner*—George Fourson
*Assistant Examiner*—S. Mulpuri
*Attorney, Agent, or Firm*—Hayes, Soloway, Hennessey, Grossman, & Hage

[57] ABSTRACT

Oxygen ions are partially implanted into a semiconductor substrate 1 to form an oxygen ion implantation area. Then, a trench 2 surrounding the oxygen ion implantation area is formed in the semiconductor substrate 1 so as to remove the outer peripheral portion of the oxygen ion implantation area. Then, the semiconductor substrate 1 are heat treated to turn the oxygen ion implantation area into a buried oxide film 4 which is stable. Then, an insulating film 3 is buried into the trench 2.

6 Claims, 11 Drawing Sheets

METHOD OF MANUFACTURING SEMICONDUCTOR DEVICE

FIELD OF THE INVENTION

The present invention relates to a method of manufacturing a semiconductor device. In particular, the present invention is effective in applying to manufacturing a hybrid type semiconductor integrated circuit device in which a transistor of SOI structure and a transistor formed at a bulk region are loaded on the same substrate.

BACKGROUND OF THE INVENTION

Conventionally, it has become easy to completely separate elements by utilizing the SOI (Silicon On Insulator) structure, and it has become possible to suppress soft errors and latch-up peculiar to CMOS. Further, it has become evident that, if a surface Si layer of SOI is thinned to about 100 nm and the impurity concentration is also controlled to relatively low so that the substantially entire Si layer of SOI is depleted, then further excellent effects such as suppression of short channel effect and increase of current driving capability of MOSFET can be obtained. As a technique for evenly forming a thin film SOI layer on the order of 100 nm over a large area, a SIMOX (Separation by IMplantation OXygen) method has very vigorously been studied. In this method, oxygen ions are implanted deep into the Si substrate at a high concentration, and Si and the oxygen are made to react with each other in the subsequent heat treatment to form a buried $SiO_2$ layer in the Si substrate leaving a thin monocrystalline Si layer on the surface thereof. The amount of oxygen implanted is selected to be about $10^{18}$ cm$^{-2}$ and an acceleration voltage of ion implantation is selected to be 150 to 200 KeV. After implantation, a high heat treatment is conducted for about 4 to 6 hours at the temperature of about 1300 degrees Centigrade.

However, if a semiconductor integrated circuit of high speed operation and low power consumption in which the MOS transistor and the bipolar transistor are hybridized on the SOI substrate, then the following problems occur. Hereinafter such a semiconductor integrated circuit is abbreviated as BiCMOS circuit.

In the MOS transistor adopting the SOI structure, it is necessary to make the Si layer thin in order to completely deplete a channel forming area in the operating condition and to prevent a kink characteristic. Typically, the Si layer is formed having a thickness of below 100 nm. In the BiCMOS circuit, it is difficult to fabricate a vertical type npn bipolar transistor at the Si thin film layer of SOI structure. That is, there is a limit posed for securing withstand voltage or maintaining the breakdown voltage sufficiently on the reduction of sizes of the n-type emitter area, p-type base area and n-type collector area taken in the longitudinal direction (vertical direction), and if, in particular, the n$^+$-type buried layer is formed, it is difficult to secure the base-collector and emitter-collector withstand voltages or maintaining the breakdown voltage sufficiently. On the other hand, unless the n$^+$-buried layer is formed, the resistance of the collector layer becomes high with the result that the saturation of the collector current becomes easy to occur and the cut-off frequency $f_T$ is lowered.

Further, there is also a method of utilizing a horizontal type npn bipolar transistor which is easy to combine with the MOS transistor of SOI structure rather than the vertical type bipolar transistor, but the former bipolar transistor is easily influenced by the effect of the substrate surface, and is difficult to obtain a high current gain and a high breakdown voltage.

In order to solve the problems which occur when the BiCMOS circuit is formed on the SOI substrate, a method of selectively providing a bulk region on the SOI substrate to form the bipolar transistor there is described in S. Matsumoto et al, ELECTRONICS LETTERS, 6th Jul., 1989, vol. 29, No. 14, pp. 904–905. However, in this method, when a local SIMOX substrate leaving the bulk region locally is manufactured according to the oxygen ion implantation process, defects often occur at the boundary between the SOI portion and the substrate portion, and the yield of the devices is likely to be reduced.

One of the methods of preventing these defects is described in Japanese Patent Application Laid-Open No. 61-121468. That is, as shown in FIGS. 1A through 1E, a resist 505 is provided at at least the principal part of a portion 500 which serves as the SOI structure on the substrate 501, a trench 504 is dug, and further, an deep oxygen ion implantation is effected selectively to the portion 500 which serves as the SOI structure by utilizing a mask 505'. It is further heat treated to change an oxygen ion implantation area 502' into a stable buried oxide film 502 to form a semiconductor substrate having a partial SOI structure.

Incidentally, in FIGS. 1A to 1E, 506 denotes an oxide film, 507 an epitaxial layer, 508 an incomplete epitaxial layer and 509 an oxide film.

However, it was found! out that the foregoing method involves the following drawbacks. That is, unless the depth of the trench 504 is formed deeper by more than a predetermined value than the depth of the buried oxide film 502, even if the foregoing method is used, defects will occur.

Figure 1A:
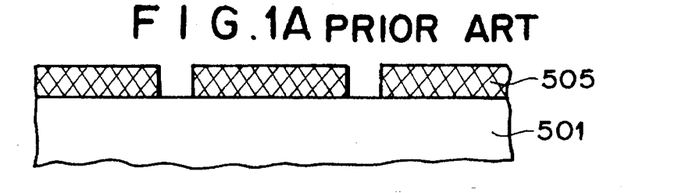
FIGS. 1A through 1E are respectively a cross-sectional view of a conventional semiconductor device.
Figure 1B:
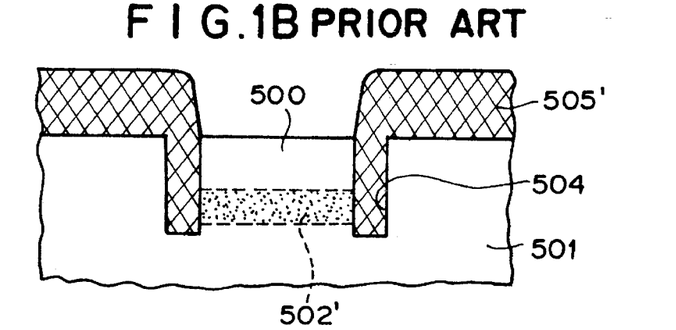
Figure 1C:
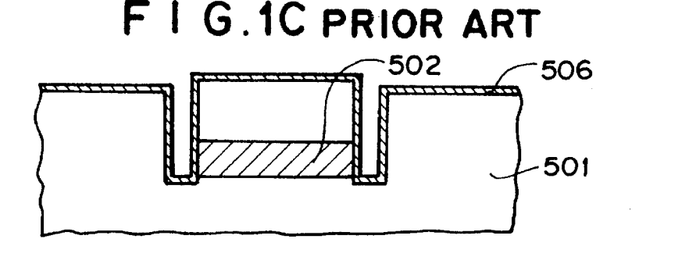
Figure 1D:
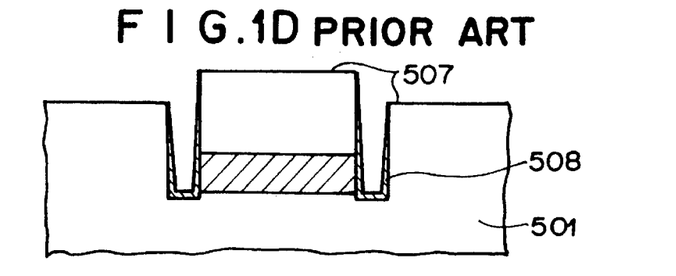
Figure 1E:
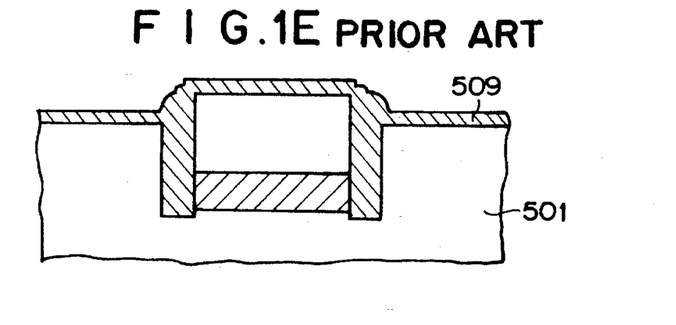
Figure 2A:
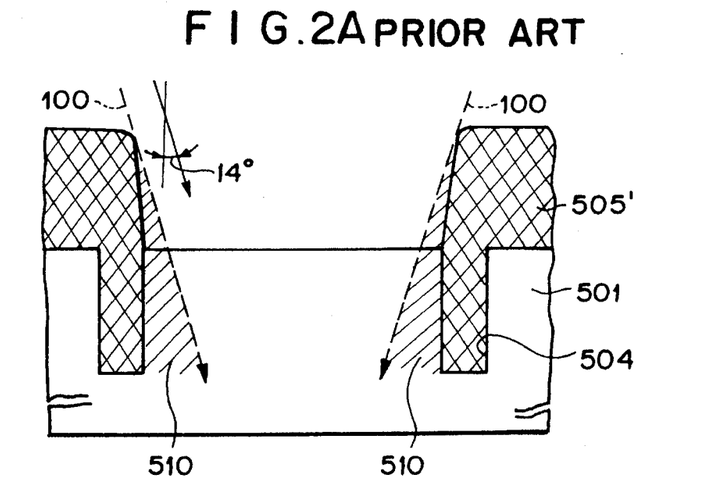
FIGS. 2A through 2C are respectively a view for explaining the problems inherent to the conventional semiconductor device.

Further, in order to evenly form a thin Si layer of about 100 nm within the substrate surface, it is necessary to prevent channeling and, to this end, the substrate is disposed within the ion implantation apparatus so that the oxygen ion beam comes incident at an angle of 14 degrees relative to the normal line of the substrate 501. Therefore, if, as shown in FIG. 2A, after the trench 504 is previously formed within the semiconductor substrate 501, oxygen ions are implanted (as indicated by arrow 100), an area 510 shadowed by a mask 505' as ions are implanted is formed, and oxygen ions cannot be evenly introduced into the area surrounded by the trench. Since the Shadowed portion is deficient in the amount of oxygen implanted, an excellent buried oxide film cannot be formed. For example, if the amount becomes lower than $(0.3–0.4) \times 10^{-18}$ cm$^{-2}$, then voids are formed and an evenly buried oxide film cannot be obtained. On the other hand, if the amount of oxygen implanted is increased inorder to sufficiently introduce the oxygen into the shadowed portion, then the amount at the unshadowed portion becomes too much, and after a high temperature annealing, irregularity occur on the surface of the substrate. If, for example, the amount of oxygen implanted becomes above $2.5 \times 10^{18}$ cm$^{-2}$, then the SOI surface will become rough.

Figure 2B:
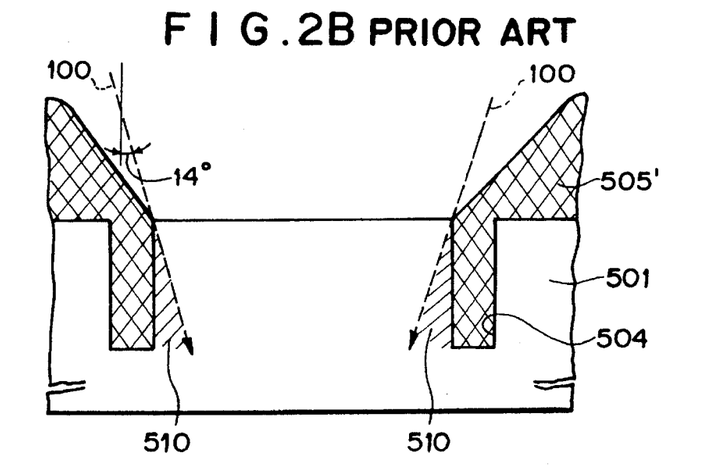
Figure 2C:
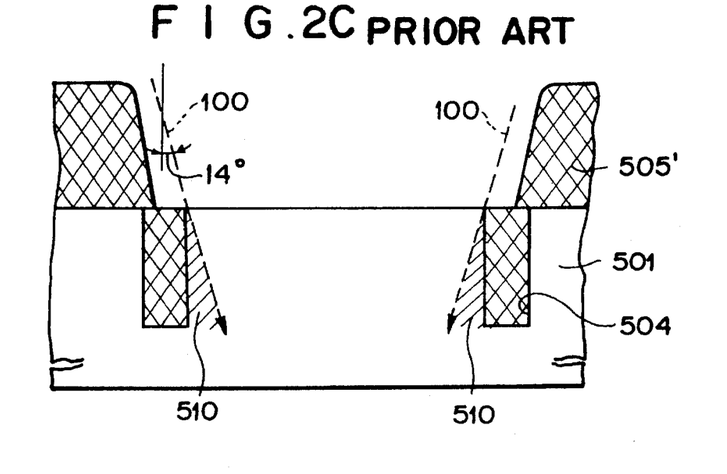

Incidentally, there are methods in which, as shown in FIG. 2B, ions are implanted with an ion implantation mask 505' having an inclined edge to make the shadowed area 510 of the mask small, or as shown in FIG. 2C, ions are implanted with an ion implantation mask 505' having an edge displaced from the inner side of the trench 504. But either of them involves a complicated process, and since there is the trench when the ions are implanted, the shadowed portion 510 cannot be completely eliminated. Therefore, a method of forming the local buried oxide film simply and evenly has been needed.

SUMMARY OF THE INVENTION

Accordingly, an object of the present invention is to prevent the defects from occurring on the boundary between the buried oxide film and the semiconductor substrate when the buried oxide film is formed locally by selectively implanting the oxygen ions.

According to a first aspect of the present invention, in order to achieve the foregoing object, there is provided a method of manufacturing a semiconductor device in which a buried oxide film is formed within a semiconductor substrate and in which an insulating film is buried within a trench formed so as to contact the perimeter of the buried oxide film, comprising steps of:

partially implanting oxygen ions into the semiconductor substrate to form an oxygen ion implantation area adapted for forming the buried oxide film;

forming the trench surrounding the oxygen ion implantation area in the semiconductor substrate so as to remove the outer peripheral portion of the oxygen ion implantation area;

heat treating the semiconductor substrate having the trench to turn the oxygen ion implantation area into the buried oxide film which is stable; and burying the insulating film into the trench.

In the first aspect, the oxygen ions may be implanted in an inclined direction relative to the normal line of the semiconductor substrate, the trench may be formed so as to also remove a semiconductor layer on the oxygen ion implantation area at an inner region adjacent to the outer peripheral portion thereof, and silicon substrate may be used as the semiconductor substrate.

According to a second aspect of the present invention, in order to achieve the foregoing object, there is provided a method of manufacturing the semiconductor device, comprising steps of:

partially implanting oxygen ions into a first semiconductor substrate to form an oxygen ion implantation area adapted for forming the buried oxide film;

forming the trench surrounding the oxygen ion implantation area in the first semiconductor substrate so as to remove the side edge peripheral portion of the oxygen ion implantation area;

heat treating the first semiconductor substrate having the trench to turn the oxygen ion implantation area into the buried oxide film which is stable;

burying the insulating film into the trench;

bonding the surface of the first semiconductor substrate which has passed through the foregoing steps to the surface of an oxide film side of a second semiconductor substrate having the surface oxide film; and removing the side of the first semiconductor substrate opposite to the side where it is bonded to the second semiconductor substrate to expose the insulating film within the trench.

According to a third aspect of the present invention, in order to achieve the foregoing object, there is provided a method of manufacturing the semidonductor device, comprising steps of:

conducting partially implanting step, trench forming step, heat treating step and burying step of the second aspect;

forming a polycrystalline silicon layer on the surface of the first semiconductor substrate which has passed through the foregoing steps;

forming an oxide film on the polycrystalline silicon layer;

bonding a second semiconductor substrate to the surface of the oxide film; and removing the side of the first semiconductor substrate opposite to the side where it is bonded to the second semiconductor substrate to expose the insulating film within the trench.

In the second and third aspects, the oxygen ions may be implanted in an inclined direction relative to the normal line of the first semiconductor substrate, and a silicon substrate may be used as the first semiconductor substrate and the second semiconductor substrate.

In the above first, second and third aspects, the trench may be formed deeper than the sum of the projected range as the oxygen ions are implanted and of three times of the standard deviation, and an oxide film or a laminated film comprising a first oxide film, nitride film and a second oxide film is used as the insulating film buried within the trench.

According to the present invention, even if the buried oxide film is provided locally, the occurrence of the defects can be prevented. Further, the vertical type npn bipolar transistor formed on the bulk region and the CMOS of SOI structure can be realized on the same substrate.

DESCRIPTION OF THE PREFERRED EMBODIMENTS

Specific embodiments of the present invention are hereinafter described with reference to the accompanying drawings.

Figure 3:
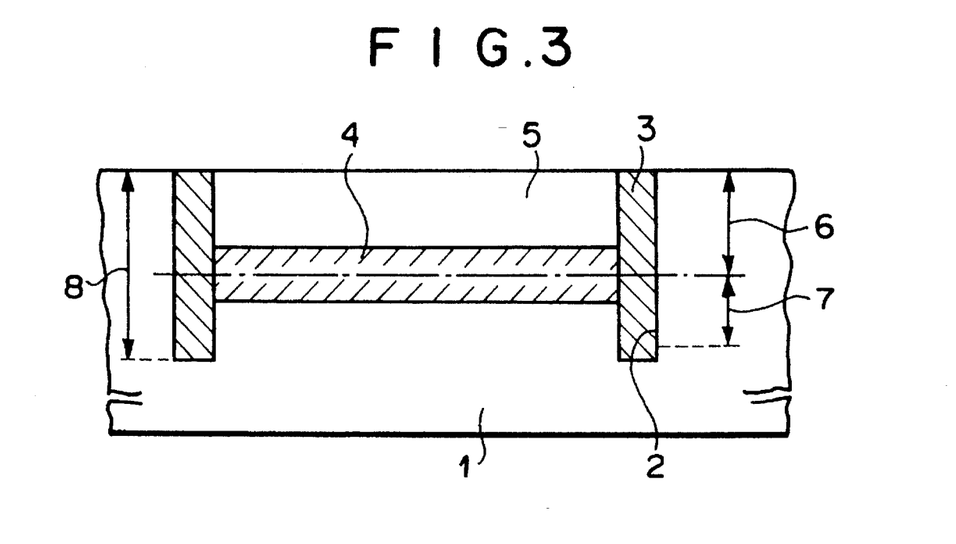
FIG. 3 is a cross-sectional view of a semiconductor device manufactured according to a method of the present invention.

FIG. 3 is a cross-sectional view of a semiconductor device manufactured according to the method of the present invention. In the same figure, a trench 2 within which an insulating film 3 is buried is provided within a semiconductor (Si) substrate 1, and a buried oxide film 4 formed by implanting oxygen ions is provided selectively at an area adjacent to and surrounded by the trench 2. Therein, 5 denotes a silicon area. Further, the depth 8 of the trench 2 is deeper than 2the sum of the projected range 6 of the ion implantation and of three times of the deviation 7.

Table 1 shows a relationship between an ion implantation energy (voltage for accelerating the oxygen ions), projected range $R_P$ and the standard deviation $\sigma$.

TABLE 1

| Ion Implantation Energy (KeV) | Projected Range $R_P$ (μm) | Standard Deviation $\sigma$ (μm) |
| --- | --- | --- |
| 50 | 0.1142 | 0.0429 |
| 100 | 0.2415 | 0.0735 |
| 150 | 0.3707 | 0.0979 |
| 200 | 0.4989 | 0.1182 |

Figure 4:
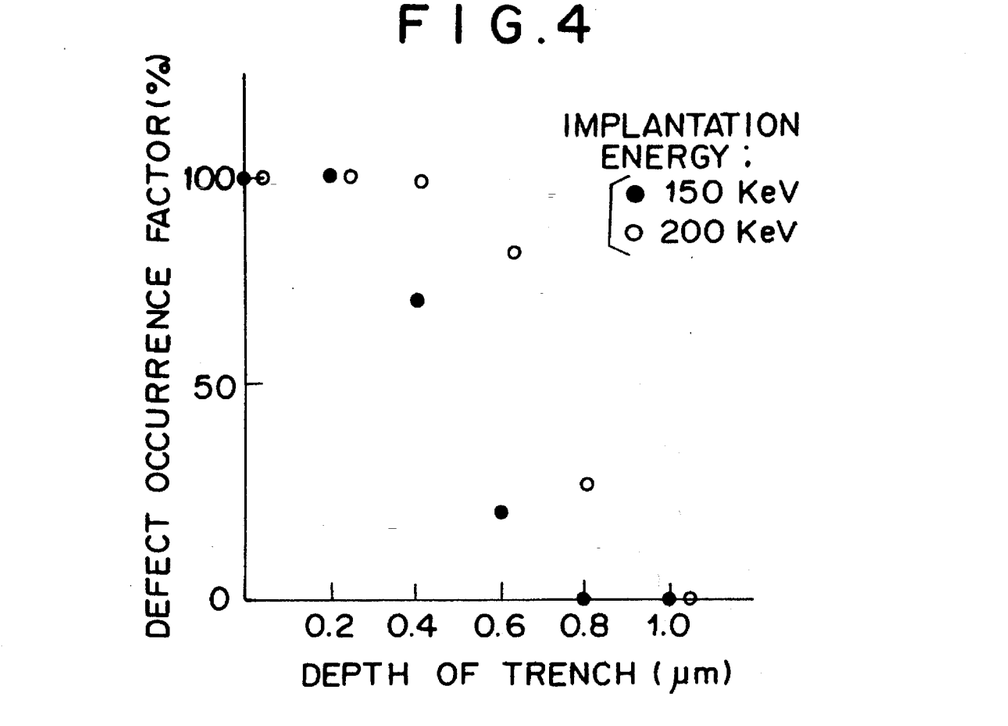
FIG. 4 is a graph illustrating a relationship between the depth of a trench and defect occurrence factor.

Further, FIG. 4 illustrates a relationship between the depth of the trench and the defect occurrence factor in the neighborhood of the trench when the voltage for accelerating of the oxygen ions is 150 KeV and 200 KeV.

As obvious from Table 1 and FIG. 4, in order to reduce the defects, it is preferable to deepen the depth of the trench greater than the sum of the projected range of the oxygen ion implantation and of three times of the deviation. If the accelerating voltage is other than 150 KeV and 200 KeV, a substantially similar result is obtained.

Further, although not shown, if using this structure two kinds of the accelerating voltage are used, then local SOI areas having two different depths or thicknesses can also be formed on the same substrate.

Next, a first embodiment of the present invention is described with reference to FIGS. 5 through 8.

Figure 5:
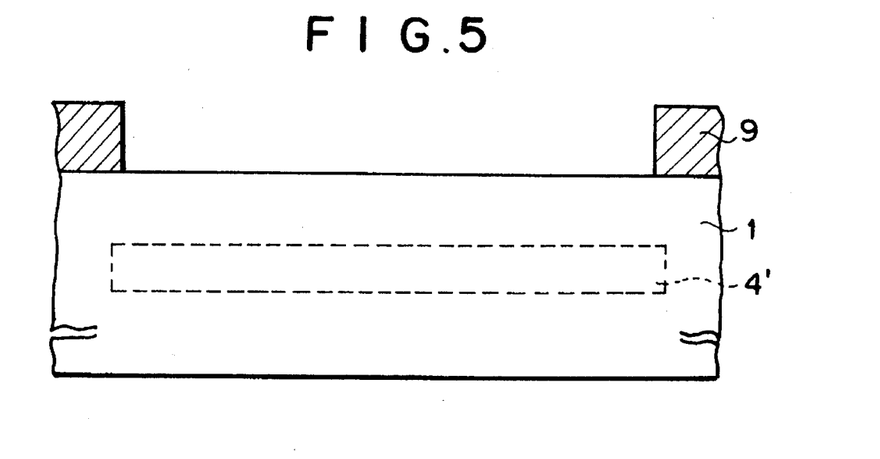
FIGS. 5 through 10 are respectively a cross-sectional view for explaining the manufacturing method according to a first embodiment of the present invention.

First, as shown in FIG. 5, a 1.7 to 1.3 μm thick oxide film mask 9 is formed on the semiconductor (Si) substrate 1, a window is locally provided in the oxide film at an area for forming the buried oxide film. Next, the oxygen ions are implanted at the accelerating voltage of 130 to 170 KeV, with the amount of $1.5 \times 10^{18}$ to $2.0 \times 10^{18}$ cm$^{-2}$, at the substrate temperature of 500 to 600 degrees Centigrade. 4' denotes an area into which the oxygen ions were implanted.

Figure 6:
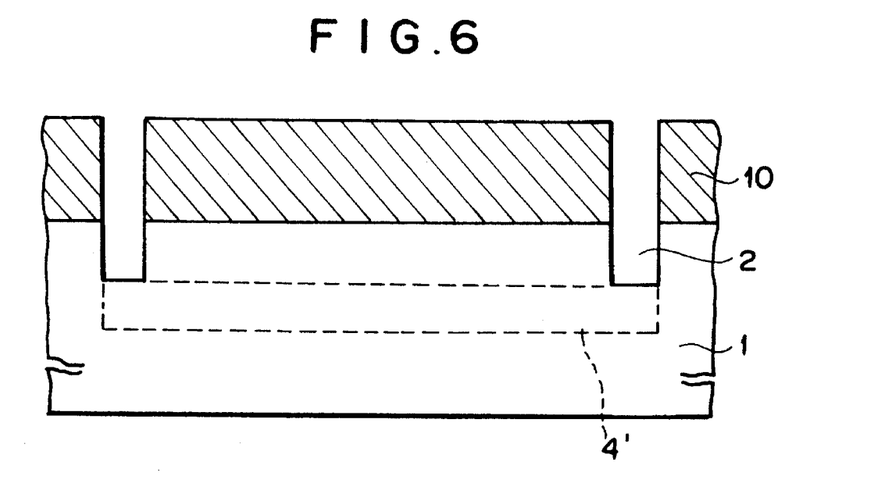

Next, as shown in FIG. 6, a photomask 10 is provided and a 0.4 to 0.6 μm wide trench 2 is formed by the photoetching process. Etching of the semiconductor substrate 1 is conducted at the silicon area with a first mixture of Cl$_2$/Ar/He gases, and when the surface of the oxygen ion implantation area 4' emerges, it is etched with a second mixture of Cl$_2$/CHF$_3$/Ar/He gases.

Figure 7:
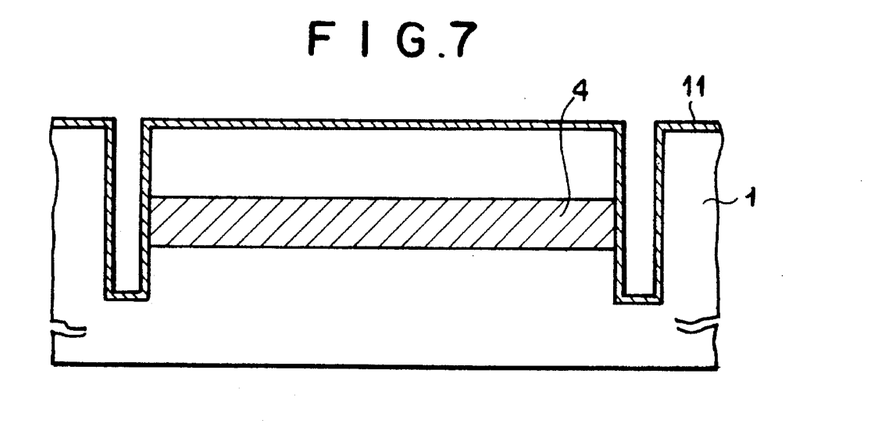
Figure 9:
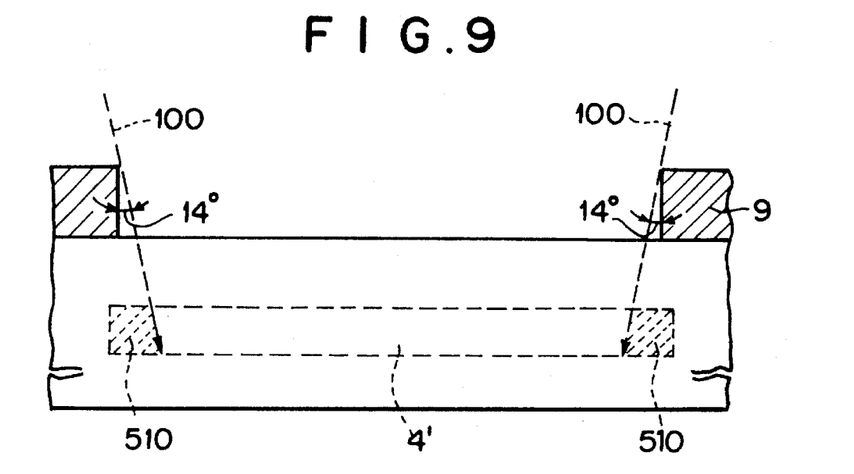
Figure 10:
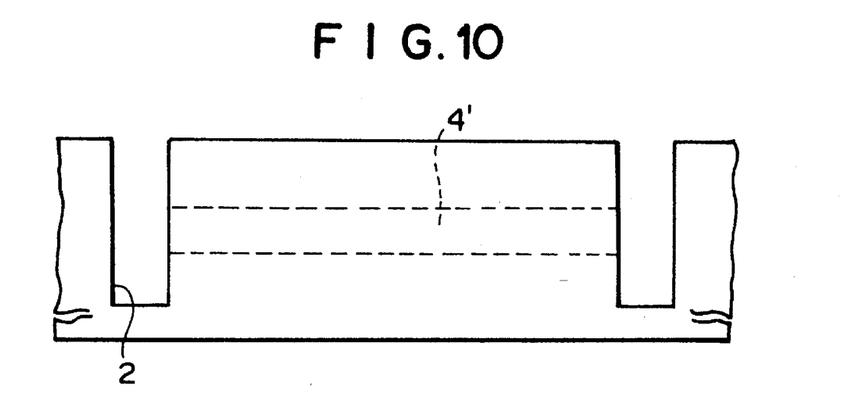
Figure 11:
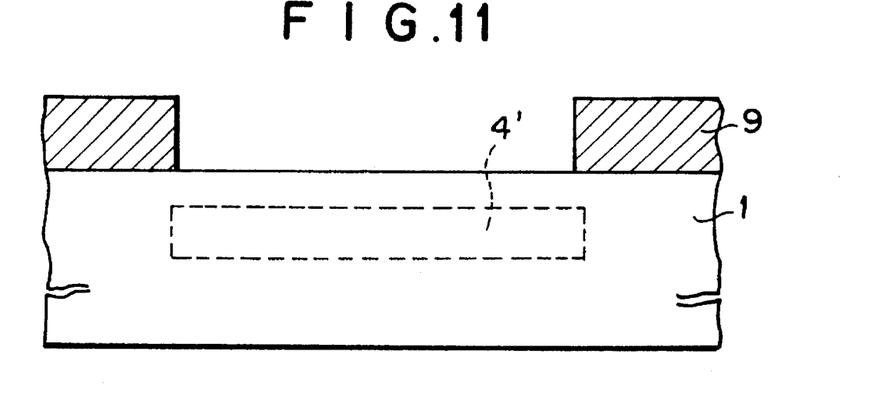
FIGS. 11 through 14 are respectively a cross-sectional view for explaining the manufacturing method according to a second embodiment of the present invention.

Next, as shown in FIG. 7, after the oxygen ion implantation area 4' has been etched, it is etched again under the condition of the first mixture of gases to form the trench having the depth of 1.0 to 1.5 μm. Incidentally, since the ion implantation is conducted angularly relative to the direction of the normal line of the substrate, as described above, the neighborhood of the edge of the oxide film mask is shadowed when the ions are implanted, and the amount of the oxygen implanted there becomes small, and after annealed at a high temperature, an excellent buried oxide film cannot be obtained. Therefore, the area for forming the trench 2 is provided, as shown in FIGS. 9 and 10, so that the area 510 shadowed by the oxide film mask 9 as the ions are implanted where the amount of the ion implanted becomes small can be simultaneously removed. Next, after a 10 through 20 nm thick oxide film 11 is formed on the semiconductor substrate 1, it is heat treated within inert gas at 1200 to 1350 degrees Centigrade for 6 to 12 hours to change the oxide ion implantation area into a stable oxide film 4. The thickness of the buried oxide film is 300 to 500 nm.

Figure 8:
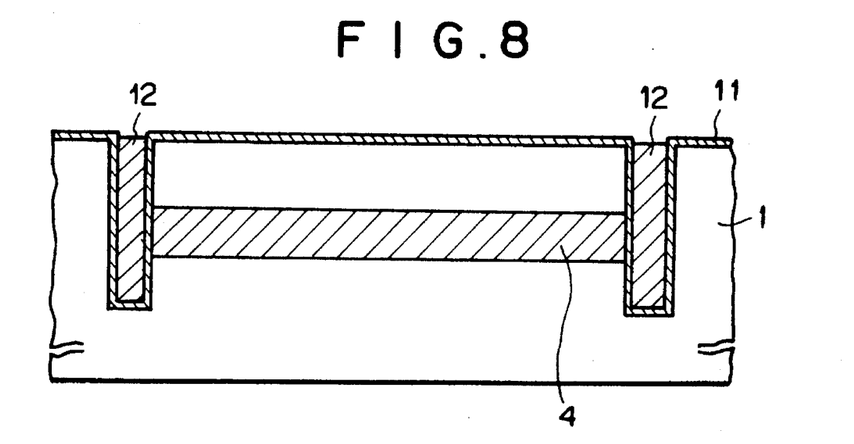

Next, as shown in FIG. 8, the interior of the trench is buried with a film 12, which is a CVD silicon oxide film or laminated film comprising silicon oxide film/silicon nitride film/silicon oxide film.

Next, a second embodiment of the present invention is described with reference to FIGS. 11 through 14. Incidentally, the same reference numerals are assigned to the same elements described in FIGS. 5 through 8.

Figure 15:
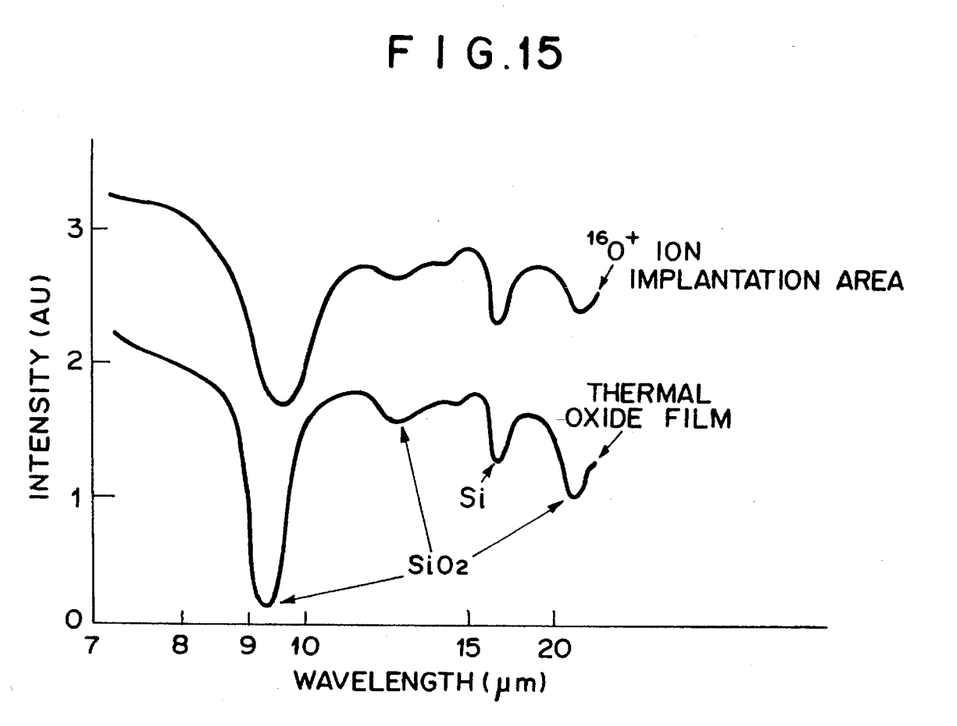
FIG. 15 is a graph illustrating an infrared absorption spectrum immediately after the oxygen ions are implanted.

According to the second embodiment, unlike the first embodiment, when the surface of the oxygen ion implantation area 4' emerges, instead of changing the etching gas to the second mixture of gases, etching is conducted with the first mixture of gases as unchanged. In the infrared absorption spectrum of FIG. 15, as evident when comparing spectrum for the oxygen ion implantation area with that for the thermal oxide film, the former is broad at the absorption peak while the absorption spectrum is generally shifted to the long wavelength side. From this, it is considered that the oxygen ion implantation area includes SiO$_2$ other than the Si—O compound, which is unstable.

Figure 12:
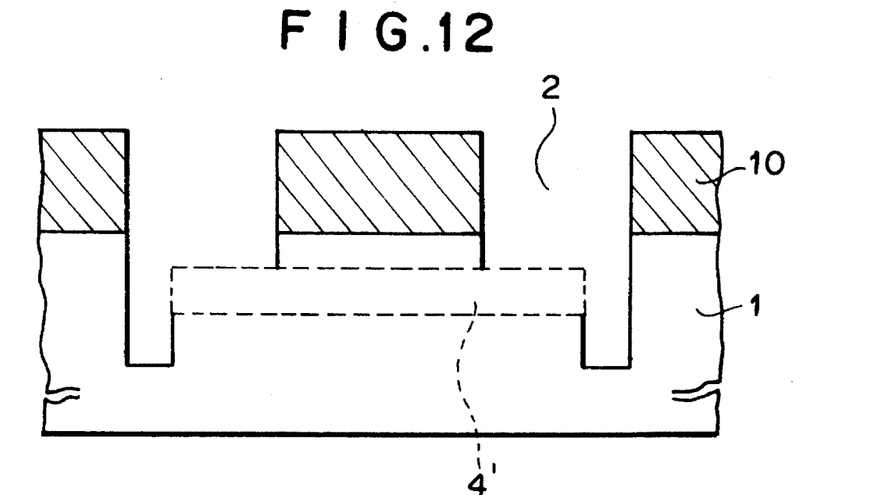
Figure 13:
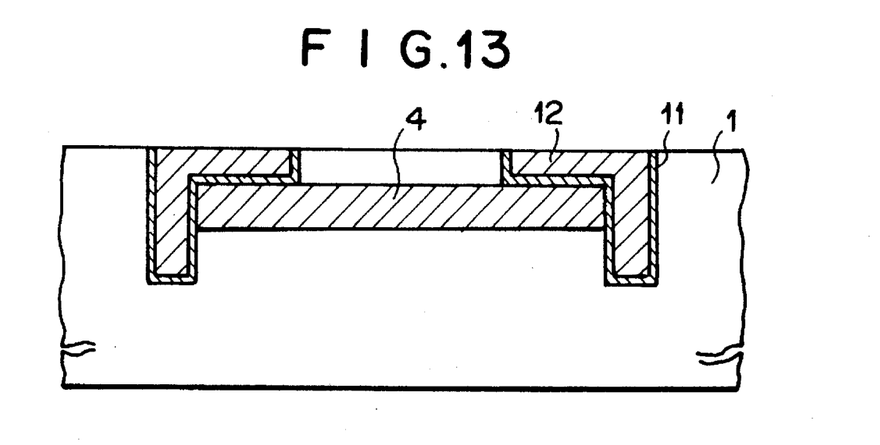
Figure 14:
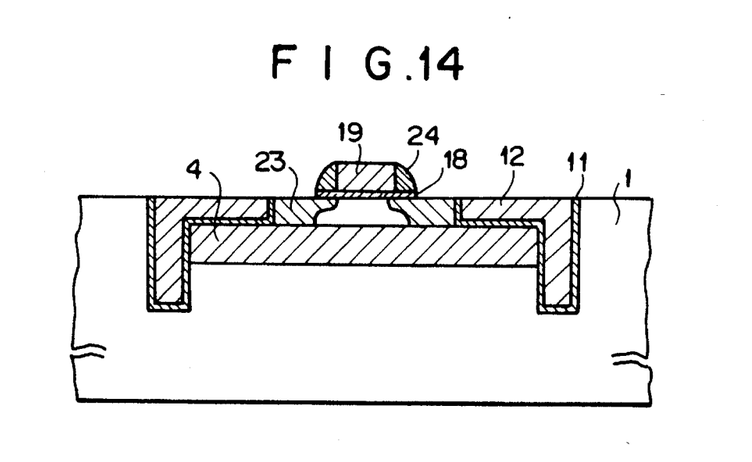

Therefore, a trench 2 having a form as shown in FIG. 12 can be obtained, if only the first mixture of gases is used which allows the silicon to be etched with a great selection ratio to the oxide film and the trench is formed so that a part thereof is overlapped with the oxygen ion implantation layer. If this form of trench is used, then both the formation of the trench for preventing the defects from occurring when the oxygen ion implantation area is annealed and a shallow separation between elements in the SOI structure can be simultaneously achieved. FIG. 14 illustrates an example in which the SOI structure is applied to a MOS transistor of CMOS, in which 18 denotes a gate oxide film, 19 a gate electrode, 23 a source/drain diffusion layer of nMOS and 24 an oxide film sidewall spacer.

In the second embodiment, since the trench has a shallow area, it is easy to bury the trench with the insulating films 11, 12 and is suitable for ultrafining rather than separating the SOI elements only with the trench deeper than the buried oxide film. On the other hand, in order to achieve this structure according to the conventional method in which the trench is formed prior to the oxygen ion implantation, both a deep trench and a shallow trench must be formed, and the process becomes extremely complicated.

Next, an application of the present invention is hereinafter described with reference to FIGS. 16 through 22. This is an embodiment in which the first embodiment of FIG. 3 is applied to a BiCMOS having a CMOS transistor of SOI structure and a bipolar transistor formed in a bulk (substrate) region.

Figure 16:
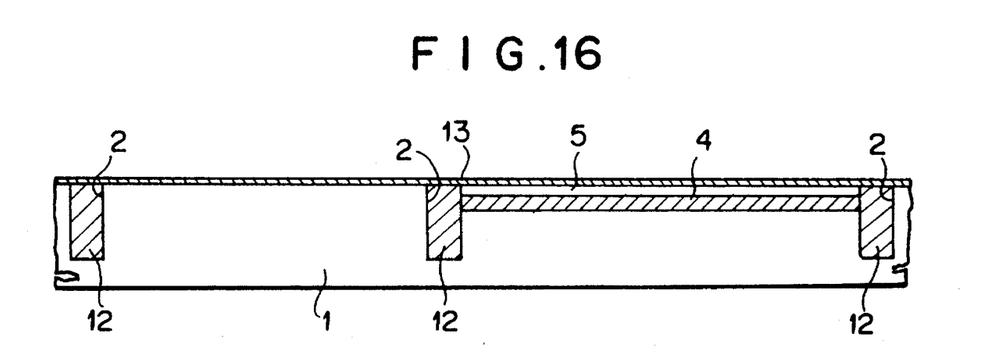
FIGS. 16 through 22 are respectively a cross-sectional view illustrating an application of the first embodiment of the present invention.

As shown in FIG. 16, the semiconductor substrate 1 is provided with an buried oxide film 4 and a trench 2 fabricated according to the first embodiment. In the embodiment, the trench 2 provided at the end portion of the buried oxide film 4 is shared for insulating the separation of the bipolar transistor.

Figure 17:
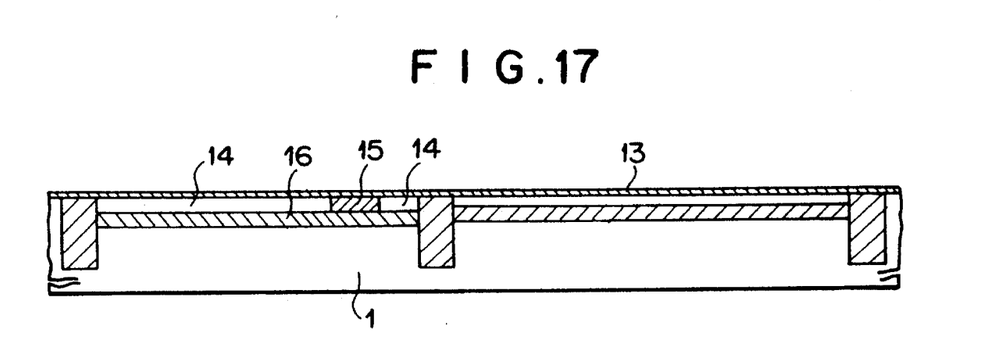

As shown in FIG. 17, after a thermal oxide film 13 is formed at a thickness of 10 to 20 nm over the entire surface of the semiconductor p-type substrate 1, an n-type impurity, for example phosphor, is implanted at the dose of $10^{13}$ to $10^{15}$ cm$^{-2}$ at the accelerating voltage of 500 to 900 KeV, and is implanted at the dose of $10^{12}$ to $10^{13}$ cm$^{-2}$ at the accelerating voltage of 150 to 300 KeV to the bulk region used as the bipolar transistor forming area to form collector areas 16, 14. Further, a collector area 19 is formed with phosphor implantation at the dose of $10^{15}$ to $10^{16}$ cm$^{-2}$ and at the accelerating voltage of 80 to 50 KeV according to the ion implantation process. Thereafter, in order to recover the damage of the ion implantation layers and to activate the impurity, the annealing process is conducted for about 30 seconds at 1000 to 1100 degrees Centigrade.

Figure 18:
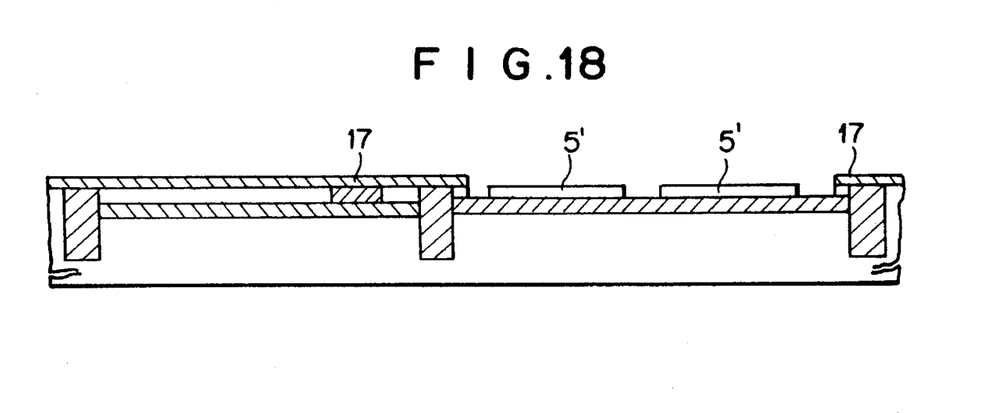

Next, as shown in FIG. 18, after the oxide film 17 is formed at the thickness of 50 to 100 nm over the entire surface of the semiconductor substrate 1, it is etched according to a photoetching process and, further, the Si layer of the MOS transistor area of SOI is selectively left in the form of an island 5'. Incidentally, the MOS transistors can be separated to each other by utilizing the known LOCOS separation method.

Figure 19:
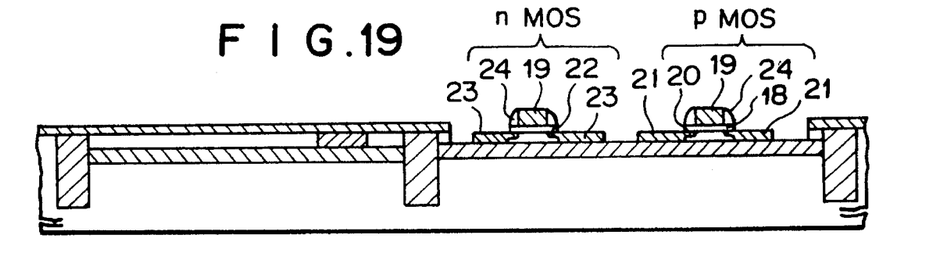

Next, as shown in FIG. 19, boron and phosphor is introduced by ion implantation process into the Si island layers 5' at the nMOS forming area and pMOS forming area respectively to adjust the threshold voltage value. Next, a 10 to 20 nm thick gate oxide film 18 is formed according to a thermal oxidation process at, for example, 800 to 900 degrees Centigrade. Next, a polycrystalline silicon layer is deposited at a thickness of 200 to 300 nm on the entire surface of the semiconductor substrate according to, for example, the CVD process. In order to reduce the resistance value, an n-type impurity, for example phosphor, is introduced into the polycrystalline silicon layer by ion implantation process. Incidentally, a polycide structure may be achieved in which a high melting metal silicide layer, for example WSi$_2$, is formed on the polycrystalline silicon layer. A polycrystalline silicon layer is etched by utilizing anisotropic etching such as RIE (Reactive Ion Etching) or the like with the photoresist used as a mask to form a gate electrode 19 of the MOS transistor. Next, an n-type impurity, for example phosphor, is introduced at the dose of $10^{13}$ to $10^{14}$ cm$^{-2}$ into the nMOS forming area at the accelerating voltage of 20 to 30 KeV, and a p-type impurity, for example BF$_2$, is implanted at the dose of $10^{13}$ to $10^{14}$ cm$^{-2}$ into the pMOS forming area at the accelerating voltage of 20 to 30 KeV. These impurities are introduced with self-alignment to the gate electrode 19 to form low concentration source/drain areas 20, 22 of LDD structure of the MOS transistor.

Next, after a 200 to 300 nm thick oxide film is deposited over the entire surface of the semiconductor substrate 1 according to the CVD process, anisotropic etching such as RIE or the like is conducted on the thickness corresponding to the deposited oxide film to form a sidewall spacer 24 on the lateral surface of the gate electrode 19. Next, an n-type impurity, for example arsenic, is introduced at the dose of $10^{15}$ to $10^{16}$ cm$^{-2}$ into the nMOS forming area at the accelerating voltage of 30 to 50 KeV, and a p-type impurity, for example BF$_2$, is introduced at the dose of $10^{15}$ to $10^{16}$ cm$^{-2}$ into the pMOS forming area at the accelerating voltage of 20 to 30 KeV. These impurities are introduced with self-alignment to the gate electrode 19 and the sidewall spacer 24 to form source/drain areas 21, 23 of the MOS transistor.

Figure 20:
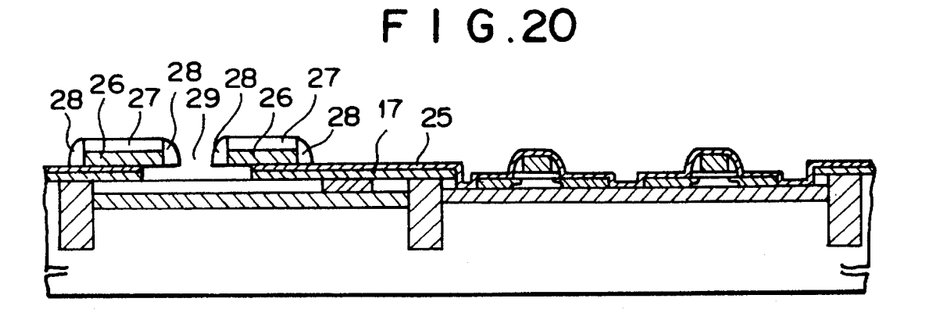

Next, as shown in FIG. 20, a 50 to 100 nm thick oxide film 25 and a 200 to 300 nm thick polycrystalline silicon film 26 are deposited sequentially on the entire surface of the semiconductor substrate 1 according to the CVD process. Next, in order to reduce the resistance and to form a base lead layer of the bipolar transistor, a p-type impurity, for example boron, is introduced at the dose of $10^{15}$ to $10^{16}$ cm$^{-2}$ into the polycrystalline silicon film 26 at the accelerating voltage of 20 to 30 KeV according to the ion implantation process.

Next, a 200 to 300 nm thick nitride film 27 is deposited over the entire surface of the polycrystalline silicon layer 26 according to the CVD process. Next, the nitride film 27 and the polycrystalline silicon film 26 are sequentially etched according to the photoetching process to form a base lead electrode and an aperture portion of the emitter area of the bipolar transistor. Next, after a 100 to 200 nm nitride film is deposited over the entire surface of the semiconductor substrate 1 according to the CVD process, it is anisotropically etched by an amount corresponding to the deposited film thickness according to the RIE process or the like to form a sidewall spacer 28 on the lateral wall of the polycrystalline silicon film 26 including the emitter aperture portion. Next, oxide films 25, 17 lying below the polycrystalline silicon film of a base forming area 29 of the bipolar transistor are removed with the photoresist used as a mask by utilizing, for example, a mixture of hydrofluoric acid and ammonium fluoride. At this time, since the insulating films on the upper and lateral walls of the polycrystalline silicon film comprise a nitride film, they are not etched by the foregoing mixture.

Figure 21:
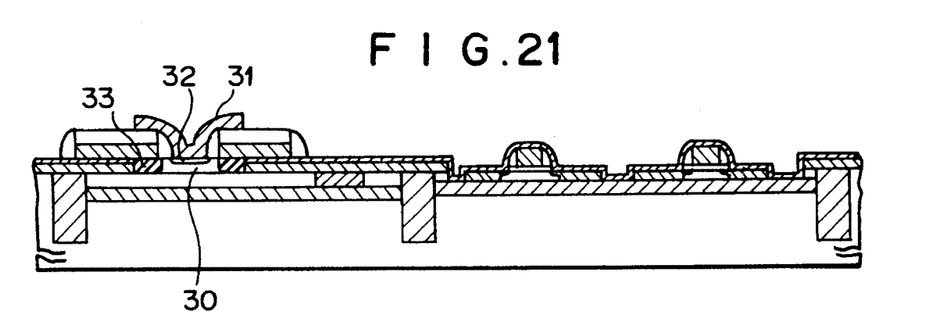

Next, as shown in FIG. 21, a 50 to 100 nm thick silicon epitaxial base layer 30 is selectively grown on the exposed surface of the semiconductor substrate 1 at the base forming area 29 of the bipolar transistor toward the lower surface of the polycrystalline silicon film 26. The growth condition is set to, for example, 650 degrees Centigrade, SiH$_4$ 20 sccm, B$_2$H$_6$ 3×10$^{-2}$ sccm. Since the surface of the semiconductor substrate other than the exposed is entirely covered with the nitride film or the oxide film, the silicon layer is not formed thereon. Next, a 200 to 300 nm thick polycrystalline silicon film is formed over the entire surface of the semiconductor substrate 1 by utilizing the CVD process. Next, after an n-type impurity, for example arsenic, is introduced at the dose of 5×10$^{15}$ to 1×10$^{16}$ cm$^{-2}$ into the polycrystalline silicon film at the accelerating voltage of 70 KeV by the ion implantation process, anisotropic etching process such as RIE or the like is carried out to leave the emitter lead electrode 31 at the emitter aperture portion of the bipolar transistor. Next, annealing is effected at a high temperature of 1000 to 1100 degrees Centigrade for 10 to 30 seconds, and arsenic introduced into the emitter lead electrode 31 is diffused into the silicon epitaxial base layer 30 so that the emitter area 32 of the bipolar transistor is formed at the depth of, for example, 20 to 50 nm. Further, boron introduced into the base lead polycrystalline silicon layer of the bipolar transistor is diffused into the epitaxial base layer 30 to form a base lead diffusion area 33.

Figure 22:
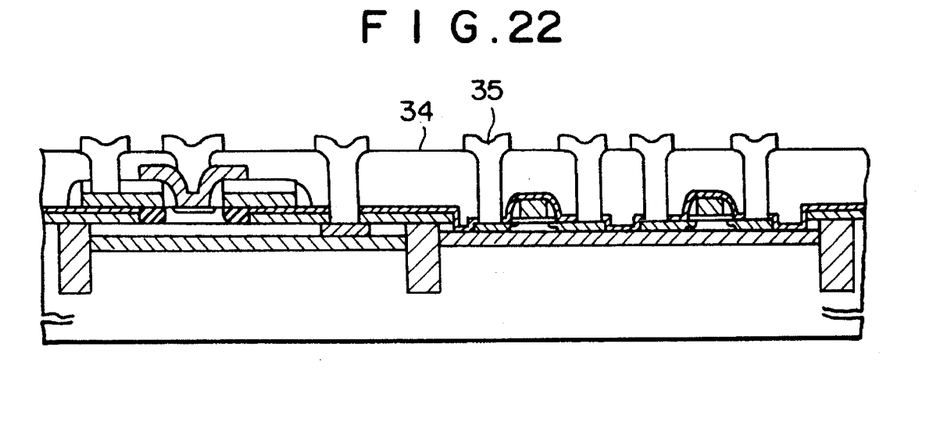

Next, as shown in FIG. 22, after an interlayer insulting film 34, for example an oxide film, is deposited at the thickness of 300 to 500 nm over the entire surface of the semiconductor substrate 1 including the bipolar transistor and the MOS transistor according to the CVD process, contact holes are formed. Then, metallic electrodes and interconnection line layers 35 are formed.

According to the foregoing process, a vertical type npn bipolar transistor at the bulk region and a CMOS of SOI structure can be realized on the same substrate.

Figure 23A:
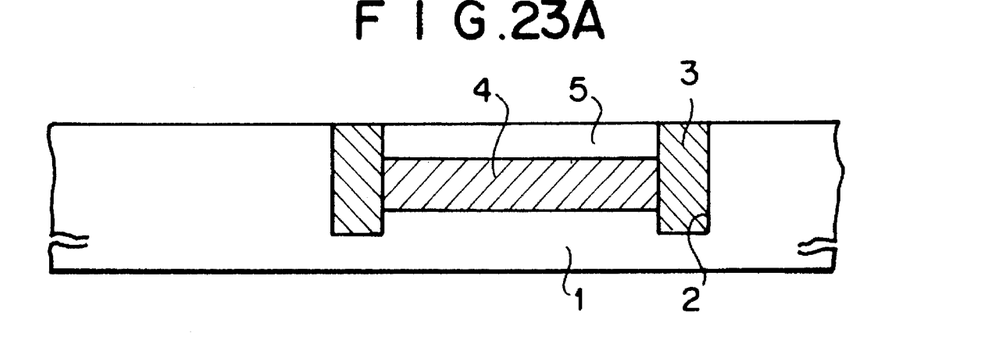
FIGS. 23A through 23C are respectively a cross-sectional view for explaining the manufacturing method according to a third embodiment of the present invention.
Figure 23B:
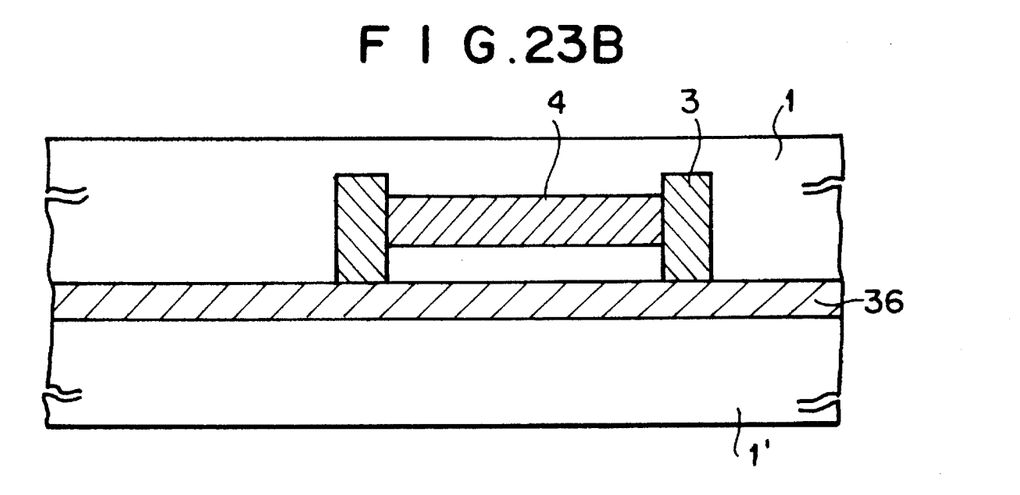
Figure 23C:
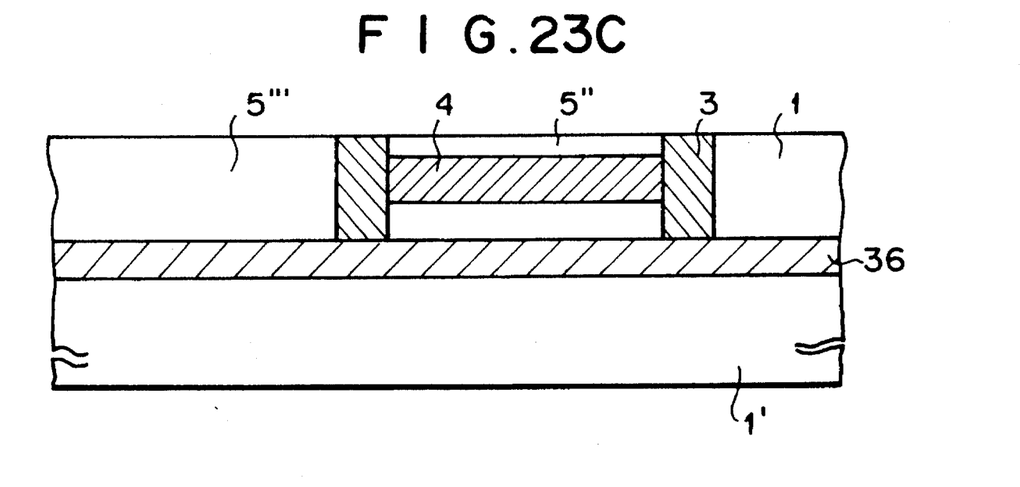
Figure 24A:
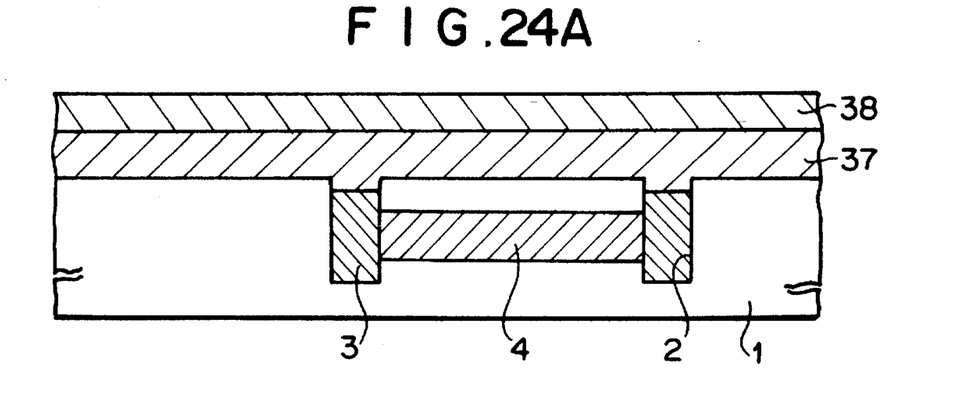
FIGS. 24A through 24C are respectively a cross-sectional view of an improved embodiment of the third embodiment of the present invention.
Figure 24B:
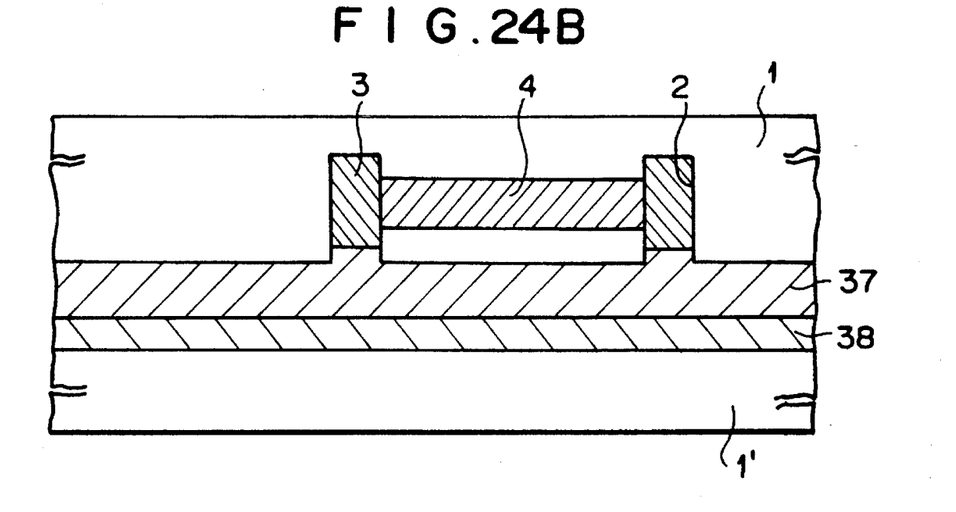
Figure 24C:
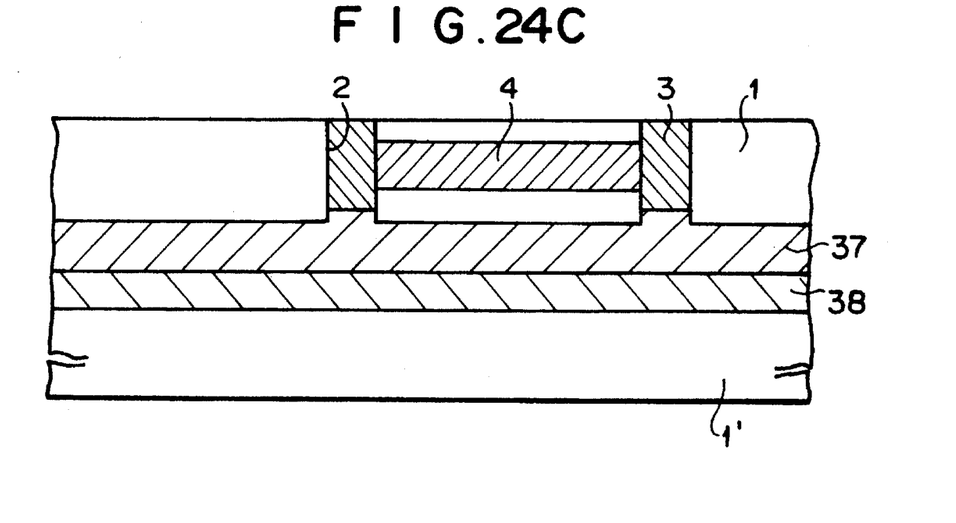

A third embodiment of the present invention is hereinafter described. A substrate 1 obtained by the first embodiment as shown in FIG. 23A is made to stick to another substrate 1' having an oxide film 36, as shown in FIG. 23B, by utilizing the SOI bonding technique, to remove the surface of the substrate 1 by polishing. As a result, as shown in FIG. 23C, in the SOI structure, areas 5" and 5''' each having a different thickness of the Si layer can be realized on the same substrate. If this substrate is used, then a bipolar transistor can be formed at the area 5''' having a thick SOI film can be formed, and a MOS transistor can be formed at the area 5"

having a thin SOI film. Incidentally, as shown in FIG. 23B, if the substrate 1 is made to bond with another substrate 1', in order to achieve an excellent bonding effect even if the trench 2 is buried insufficiently, it may be effected as shown in FIGS. 24A through 24C. After, as shown in FIG. 24A, the polycrystalline silicon film 37 is formed at the thickness of 100 to 500 nm on the surface of the substrate 1, an oxide film 38 is formed at the thickness of 100 to 500 nm on the surface of the polycrystalline silicon layer 37. Next, as shown in FIG. 24B, the substrate 1 is bonded to another substrate 1'. Then, as shown in FIG. 24C, the surface of the substrate 1 is removed by polishing.

What is claimed is:

1. Method of manufacturing a semiconductor device in which a buried oxide film is formed within a semiconductor substrate and in which an insulating film is buried within a trench formed so as to contact the perimeter of the buried oxide film, comprising steps of:

selectively implanting oxygen ions into a portion of said semiconductor substrate to form an oxygen ion implantation area adapted for forming said buried oxide film;

forming said trench surrounding said oxygen ion implantation area in said semiconductor substrate so as to remove the side edge peripheral portion of said oxygen ion implantation area;

heat treating said semiconductor substrate having said trench to turn said oxygen ion implantation area into said buried oxide film which is stable; and burying said insulating film into said trench.

2. Method of manufacturing a semiconductor device as set forth in claim 1, wherein said oxygen ions are implanted in an inclined direction relative to the normal line of said semiconductor substrate.

3. Method of manufacturing a semiconductor device as set forth in claim 1, wherein said trench is formed deeper than the sum of the projected range as said oxygen ions are implanted and of three times of the standard deviation.

4. Method of manufacturing a semiconductor device as set forth in claim 1, wherein said trench is formed so as to also remove a semiconductor layer on said oxygen ion implantation area at an inner region adjacent to the outer peripheral portion thereof.

5. Method of manufacturing a semiconductor device as set forth in claim 1, wherein a silicon substrate is used as said semiconductor substrate.

6. Method of manufacturing a semiconductor device as set forth in claim 1, wherein an oxide film or a laminated film comprising a first oxide film, nitride film and a second oxide film is used as said insulating film buried within said trench.

* * * * *